United States Patent
Fujioka

(10) Patent No.: US 12,111,357 B2
(45) Date of Patent: Oct. 8, 2024

(54) DIAGNOSTIC APPARATUS

(71) Applicant: Mitsubishi Electric Corporation, Tokyo (JP)

(72) Inventor: Katsuhiko Fujioka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 761 days.

(21) Appl. No.: 17/283,271

(22) PCT Filed: Dec. 12, 2018

(86) PCT No.: PCT/JP2018/045712
§ 371 (c)(1),
(2) Date: Apr. 7, 2021

(87) PCT Pub. No.: WO2020/121442
PCT Pub. Date: Jun. 18, 2020

(65) Prior Publication Data
US 2021/0382109 A1    Dec. 9, 2021

(51) Int. Cl.
*G01R 31/327* (2006.01)
*G06F 3/06* (2006.01)
*H01H 9/54* (2006.01)

(52) U.S. Cl.
CPC ......... *G01R 31/327* (2013.01); *G06F 3/0619* (2013.01); *G06F 3/0659* (2013.01); *G06F 3/0673* (2013.01); *H01H 9/54* (2013.01)

(58) Field of Classification Search
None
See application file for complete search history.

(56) References Cited

U.S. PATENT DOCUMENTS

| | | |
|---|---|---|
| 5,636,134 A | 6/1997 | Johnson et al. |
| 2009/0265064 A1* | 10/2009 | Furuno .................. G06Q 10/00 701/50 |
| 2015/0051749 A1 | 2/2015 | Hancock et al. |

FOREIGN PATENT DOCUMENTS

| | | |
|---|---|---|
| CN | 103323771 B | 6/2015 |
| CN | 108267687 A | 7/2018 |
| EP | 1085635 A2 | 3/2001 |
| JP | 2001235498 A | 8/2001 |

(Continued)

OTHER PUBLICATIONS

English machine translation of O'Keeffe et al. (JP 2001235498 A) (Year: 2001).*

(Continued)

*Primary Examiner* — Walter L Lindsay, Jr.
*Assistant Examiner* — Geoffrey T Evans
(74) *Attorney, Agent, or Firm* — Buchanan Ingersoll & Rooney PC

(57) ABSTRACT

A diagnostic apparatus diagnoses a symptom of anomaly in a device that operates for making or breaking a circuit. The diagnostic apparatus includes a factor probability calculation unit that calculates a factor probability. The factor probability calculation unit calculates a factor probability for each matter that may be a factor in a symptom observed in the device, the factor probability being a probability that the matter truly corresponds to a factor for the observed symptom. The diagnostic apparatus can obtain useful information for improving the operating state of the device.

8 Claims, 4 Drawing Sheets

(56) References Cited

FOREIGN PATENT DOCUMENTS

| | | |
|---|---|---|
| JP | 2003308751 A | 10/2003 |
| JP | 2010165321 A | 7/2010 |
| JP | 2018005387 A | 1/2018 |

OTHER PUBLICATIONS

English machine translation of Kikuchi (JP 2010165321 A) (Year: 2010).*

Extended European Search Report dated Nov. 2, 2021, issued in corresponding European Patent Application No. 18942799.0, 13 pages.

International Search Report (PCT/ISA/210) and Written Opinion (PCT/ISA/237) mailed on Mar. 12, 2019, by the Japan Patent Office as the International Searching Authority for International Application No. PCT/JP2018/045712. (9 pages).

Notice of Reasons for Refusal mailed on Jul. 2, 2019, by the Japan Patent Office in Japanese Patent Application No. 2019-528608. (11 pages).

* cited by examiner

FIG.5

| SYMPTOM OF ANOMALY | FACTOR | ASSEMBLY | VERIFICATION DATA | SENSOR INFORMATION, HISTORY INFORMATION | FACTOR PROBABILITY (FACTOR VALUE) |
|---|---|---|---|---|---|
| DECREASE IN OPERATION SPEED | DETERIORATION OF GREASE | MECHANISM UNIT | 40 | GREASE REAPPLIED (COEFFICIENT 0.3) | 12% (12) |
| | DECREASE IN HYDRAULIC PRESSURE | OPERATION SOURCE (HYDRAULIC PRESSURE) | 30 | LOW HYDRAULIC PRESSURE (COEFFICIENT 2.0) | 59% (60) |
| | EXCESSIVE OPERATION CONTROL | OPERATION CONTROL MECHANISM | 30 | - (COEFFICIENT 1.0) | 29% (30) |
| OVERSHOOT OF OPERATION WAVEFORM | EXCESSIVE HYDRAULIC PRESSURE | OPERATION SOURCE (HYDRAULIC PRESSURE) | 30 | HIGH HYDRAULIC PRESSURE (COEFFICIENT 2.0) | 46% (60) |
| | INSUFFICIENT OPERATION CONTROL | OPERATION CONTROL MECHANISM | 70 | - (COEFFICIENT 1.0) | 54% (70) |

FIG.6

| IMPROVEMENT DETAILS | ADJUSTMENT ITEM | ADJUST-MENT RATE |
|---|---|---|
| IMPROVEMENT IN OPERATION SPEED | IMPROVEMENT IN HYDRAULIC PRESSURE | 80% |
| | RELAXATION OF OPERATION CONTROL | 20% |
| ELIMINATION OF OVERSHOOT | RELAXATION OF HYDRAULIC PRESSURE | 10% |
| | IMPROVEMENT IN OPERATION CONTROL | 90% |

DIAGNOSTIC APPARATUS

FIELD

The present invention relates to a diagnostic apparatus that diagnoses a device that makes or breaks a circuit.

BACKGROUND

In a device such as a circuit breaker or a disconnector that makes or breaks a circuit, an operating time that is an amount of time between input of an operation command and completion of the operation responsive thereto may change depending on conditions such as the pressure of an operation source, the temperature of the surroundings of the device, and a control voltage during the operation. In the case where the device is used for many years, the operation speed of the device may become lower than at the outset of the device being brought into operation for the reason of a secular change in the operation source or a mechanism unit. In addition, in the case where the device is not used under appropriate conditions, the device may be operated at an excessive speed.

Regarding a device for monitoring operating characteristics of a switch, Patent Literature 1 discloses a technique of obtaining a detection value for a parameter that affects the switching operation of the switch and diagnosing a symptom of anomaly with use of a switching operation time corrected based on a difference between a reference value and the detection value of the parameter.

CITATION LIST

Patent Literature

Patent Literature 1: Japanese Patent Application Laid-open No. 2003-308751

SUMMARY

Technical Problem

When it is confirmed that there is a symptom of anomaly, the technique of Patent Literature 1 listed above, which is a conventional art, requires a detailed investigation for identifying a factor in the symptom. Therefore, in the conventional art, there has been a problem that it is difficult to obtain useful information for improving the operating state of the device.

The present invention has been made in view of the above circumstances, and an object of the present invention is to provide a diagnostic apparatus capable of obtaining useful information for improving the operating state of a device.

Solution to Problem

In order to solve the above-described problem and achieve the object, the present invention provides a diagnostic apparatus for diagnosing a symptom of an anomaly in a device configured to perform an operation for making or breaking a circuit, the apparatus comprising: a factor probability calculation unit to calculate a factor probability for each matter that may be a factor in a symptom observed in the device, the factor probability being a probability that the matter truly corresponds to a factor for the observed symptom.

Advantageous Effects of Invention

The diagnostic apparatus according to the present invention has an advantageous effect that useful information for improving the operating state of a device can be obtained.

BRIEF DESCRIPTION OF DRAWINGS

FIG. 5 is a chart used for describing calculation of factor probability performed by a factor probability calculation unit included in the diagnostic apparatus according to the first embodiment.

FIG. 6 is a chart used for describing determination of details of a proposal made by an improvement processing unit included in the diagnostic apparatus according to the first embodiment.

DESCRIPTION OF EMBODIMENTS

Hereinafter, a diagnostic apparatus according to an embodiment of the present invention will be described in detail with reference to the drawings. Note that the present invention is not necessarily limited by the embodiment.

First Embodiment

Figure 1:
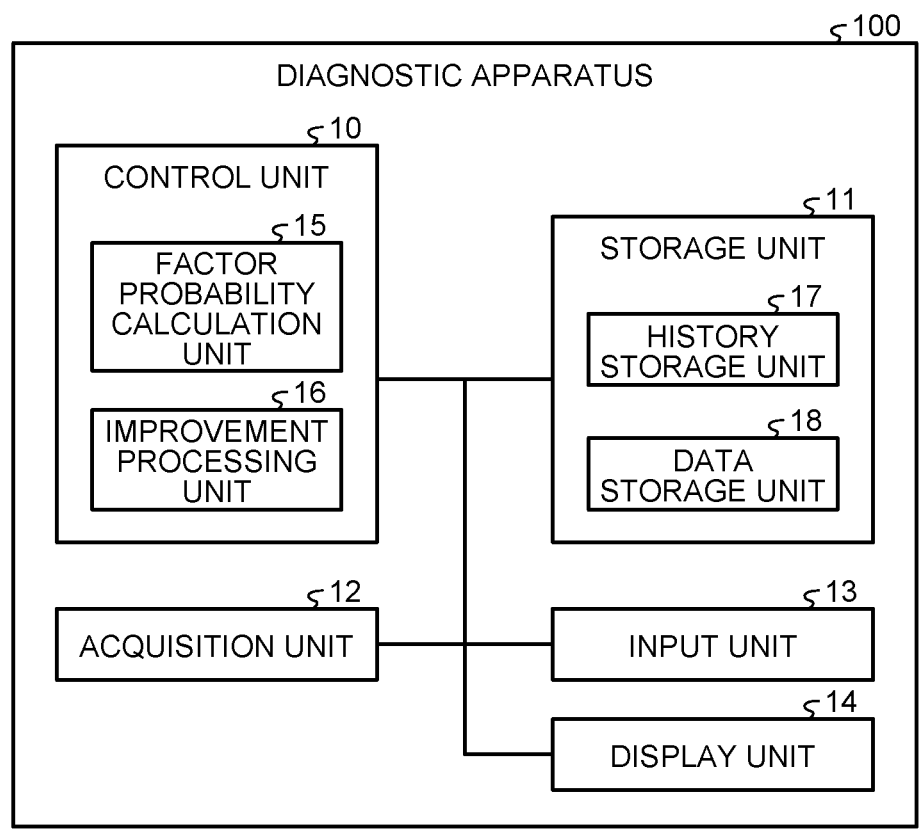
FIG. 1 is a block diagram illustrating a functional configuration of a diagnostic apparatus according to a first embodiment of the present invention.

FIG. 1 is a block diagram illustrating a functional configuration of a diagnostic apparatus 100 according to a first embodiment of the present invention. The diagnostic apparatus 100 diagnoses a symptom of anomaly in a device that operates for making or breaking a circuit. The device that operates for making or breaking a circuit refers to a switch such as a circuit breaker or a disconnector.

The diagnostic apparatus 100 includes a control unit 10, a storage unit 11, an acquisition unit 12, an input unit 13, and a display unit 14. The control unit 10 controls the diagnostic apparatus 100. The storage unit 11 stores information therein. The acquisition unit 12 acquires information from a device external to the diagnostic apparatus 100. The input unit 13 is configured to input information to the diagnostic apparatus 100. The display unit 14 displays information.

The control unit 10 includes a factor probability calculation unit 15 and an improvement processing unit 16. The factor probability calculation unit 15 calculates a factor probability for each matter that may be a factor in a symptom observed in a device that is an object to be diagnosed. The factor probability is the probability that a matter corresponds to a factor in the observed symptom. The improvement processing unit 16 determines details of a proposal for improving the observed symptom.

The storage unit 11 includes a history storage unit 17 and a data storage unit 18. The history storage unit 17 stores history information. The data storage unit 18 stores verification data. The history information is information representing the history of maintenance received by the device to be diagnosed. The verification data is data verified for each of symptoms that may occur in the device to be diagnosed, which represents probabilities that each of two or more matters that may be factors in the symptoms corresponds to a factor in the symptom.

The acquisition unit 12 acquires measurement data representing the result of measuring the state of the device to be diagnosed. The measurement data is sent from various kinds of sensors that are devices for measurement to the acquisition unit 12. The input unit 13 receives an operation for inputting the history information and the verification data. The display unit 14 displays a calculation result of a factor probability of the factor probability calculation unit 15 and the details of the proposal determined by the improvement processing unit 16.

Next, a hardware configuration the diagnostic apparatus 100 has will be described. The function of the control unit 10 included in the diagnostic apparatus 100 is implemented with use of processing circuitry. The processing circuitry corresponds to dedicated hardware installed in the diagnostic apparatus 100. The processing circuitry may be a processor configured to execute a program stored in a memory.

Figure 2:
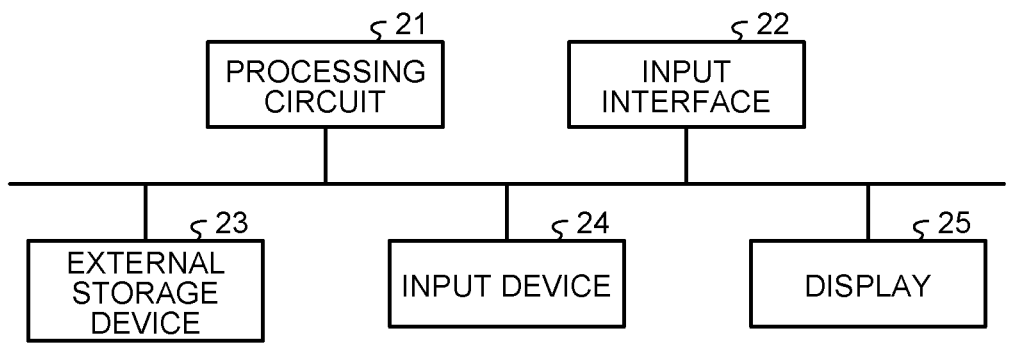
FIG. 2 is a first diagram illustrating an example of a hardware configuration of the diagnostic apparatus according to the first embodiment.

FIG. 2 is a first diagram illustrating an example of the hardware configuration of the diagnostic apparatus 100 according to the first embodiment. FIG. 2 illustrates a hardware configuration in a case when the function of the control unit 10 illustrated in FIG. 1 is implemented with use of dedicated hardware. The diagnostic apparatus 100 includes a processing circuit 21, an input interface 22, an external storage device 23, an input device 24, and a display 25. The processing circuit 21 executes various kinds of processes. The input interface 22 is a connection interface between the diagnostic apparatus 100 and an external device. The external storage device 23 stores various types of information therein. The input device 24 is configured to which information is inputted. The display 25 is an output device that displays information on a screen thereof. The units of the diagnostic apparatus 100 illustrated in FIG. 2 are interconnected via a bus.

The processing circuit 21 that is based on the dedicated hardware is realized by a single circuit, a composite circuit, a programmed processor, a parallel-programmed processor, an application specific integrated circuit (ASIC), a field-programmable gate array (FPGA), or a combination thereof. Functions of the factor probability calculation unit 15 and the improvement processing unit 16 illustrated in FIG. 1 are implemented using the processing circuit 21.

The function of the acquisition unit 12 illustrated in FIG. 1 is implemented with use of the input interface 22. The external storage device 23 is a hard disk drive (HDD) or a solid state drive (SSD). Functions of the history storage unit 17 and the data storage unit 18 included in the storage unit 11 illustrated in FIG. 1 are implemented with use of the external storage device 23. The input device 24 includes a keyboard and a pointing device. The function of the input unit 13 illustrated in FIG. 1 is implemented with use of the input device 24. One example of the display 25 is a liquid crystal display equipped with a liquid crystal panel. The function of the display unit 14 illustrated in FIG. 1 is implemented with use of the display 25.

Figure 3:
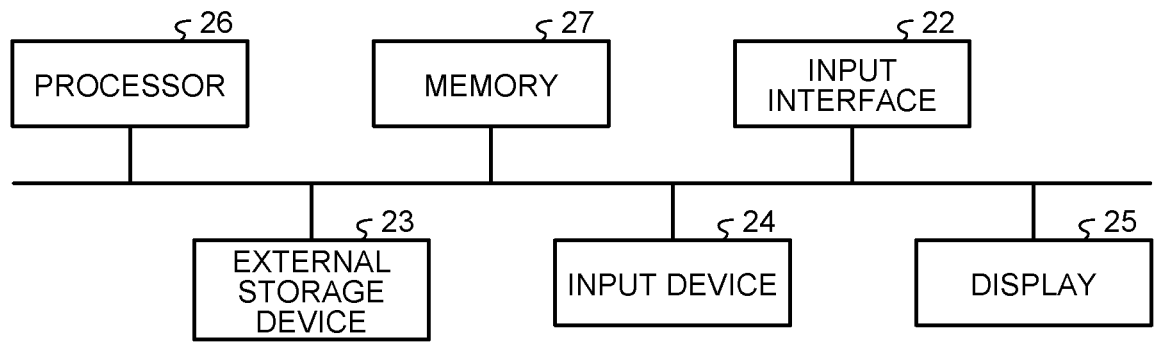
FIG. 3 is a second diagram illustrating an example of the hardware configuration of the diagnostic apparatus according to the first embodiment.

FIG. 3 is a second diagram illustrating an example of the hardware configuration of the diagnostic apparatus 100 according to the first embodiment. FIG. 3 illustrates a hardware configuration in a case when the function of the control unit 10 illustrated in FIG. 1 is implemented with use of a hardware set that executes a program. A processor 26 and a memory 27 are mutually connected with the input interface 22, the external storage device 23, the input device 24, and the display 25.

The processor 26 is a central processing unit (CPU), a processing device, an arithmetic device, a microprocessor, a microcomputer, or a digital signal processor (DSP). Functions of the factor probability calculation unit 15 and the improvement processing unit 16 illustrated in FIG. 1 are implemented by the processor 26 and software, firmware, or a combination of software and firmware. The software or firmware is described as a program, and stored in the memory 27 that is a built-in memory. The memory 27 is a nonvolatile or volatile semiconductor memory. Examples of the memory 27 include a random access memory (RAM), a read only memory (ROM), a flash memory, an erasable programmable read only memory (EPROM), and an electrically erasable programmable read only memory (EEPROM) (registered trademark).

Figure 4:
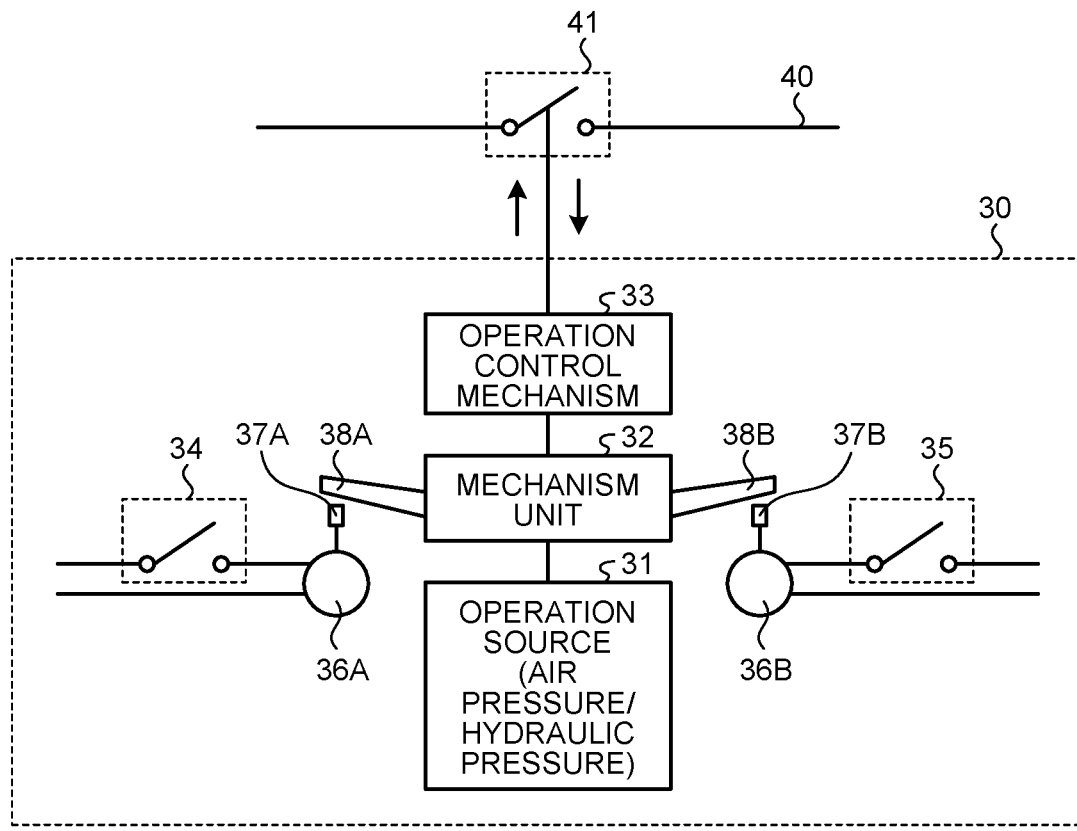
FIG. 4 is a diagram illustrating an example of a device to be diagnosed by the diagnostic apparatus according to the first embodiment.

Next, a device that is an object to be diagnosed by the diagnostic apparatus 100 will be described. FIG. 4 is a diagram illustrating an example of the device to be diagnosed by the diagnostic apparatus 100 according to the first embodiment. FIG. 4 illustrates a schematic configuration of a circuit breaker 30 that is an example of the device to be diagnosed. The circuit breaker 30 operates a circuit contactor 41 provided in an electric path 40 in a facility such as a substation or a switching station. The electric path 40 is opened by an electrode-opening operation of the circuit contactor 41, and closed by an electrode-closing operation of the circuit contactor 41. The circuit breaker 30 performs a pulling-out operation for the electrode-opening operation of the circuit contactor 41 and a putting-in operation for the electrode-closing operation of the circuit contactor 41.

The circuit breaker 30 includes a mechanism unit 32, an operation source 31, and an operation control mechanism 33. The mechanism unit 32 performs an operation of the circuit contactor 41 for the pulling-out operation, and an operation of the circuit contactor 41 for the putting-in operation. The operation source 31 drives the mechanism unit 32. The operation control mechanism 33 controls the pulling-out operation and the putting-in operation. The operation source 31 drives the mechanism unit 32 by means of air pressure or hydraulic pressure.

The operation control mechanism 33 is a mechanism for preventing occurrence of an excessive impulsive force. A hydraulic shock absorber can be used for the operation control mechanism 33. The operation control mechanism 33 may be a shock absorber other than the hydraulic shock absorber, and may be a spring shock absorber or the like.

In the state where the electric path 40 is closed, some pressure for the pulling-out operation is stored in the operation source 31. The pulling-out operation is blocked by a pulling-out latch mechanism included in the mechanism unit 32. Furthermore, in the state where the electric path 40 is opened, some pressure for the putting-in operation is stored in the operation source 31. The putting-in operation is blocked by a putting-in latch mechanism included in the mechanism unit 32. Note that the pulling-out latch mechanism and the putting-in latch mechanism are not illustrated in FIG. 4 for their omission. In addition, the mechanism unit 32 is provided with a latch 38A and a latch 38B. The latch 38A is configured to release the pulling-out latch mechanism. The latch 38B is configured to release the putting-in latch mechanism.

The circuit breaker 30 has a switch 34 and a switch 35 provided therein. The switch 34 switches from "off" to "on" according to a command for performing the pulling-out operation. The switch 35 switches from "off" to "on" according to a command for performing the putting-in operation. A coil 36A is connected to the switch 34.

When the switch 34 is on, a control voltage is applied to the coil 36A. The coil 36A is excited by the application of the control voltage to operate a plunger 37A. The plunger 37A moves toward the latch 38A from a position away from the latch 38A, and then presses against the latch 38A.

The pulling-out latch mechanism is released by movement of the latch 38A pressed by the plunger 37A. The circuit breaker 30 performs a pulling-out operation by the release of the pulling-out latch mechanism.

A coil 36B is connected to the switch 35. When the switch 35 is on, a control voltage is applied to the coil 36B. The coil 36B is excited by the application of the control voltage to operate a plunger 37B. The plunger 37B moves toward the latch 38B from a position away from the latch 38B, and then presses against the latch 38B. The putting-in latch mechanism is released by movement of the latch 38B pressed by the plunger 37B. The circuit breaker 30 performs a putting-in operation by the release of the putting-in latch mechanism.

Various kinds of sensors for measuring the state of the circuit breaker 30 are installed in the circuit breaker 30. The sensors installed in the circuit breaker 30 are not illustrated in FIG. 4. Examples of the sensors installed in the circuit breaker 30 include a sensor that measures an air pressure or hydraulic pressure in the operation source 31, a sensor or sensors that measure control voltages applied to the coils 36A and 36B, a sensor or sensors that measure the waveforms of electric currents flowing through the coils 36A and 36B, and a sensor that measures the temperature of the surroundings of the circuit breaker 30. Furthermore, the circuit breaker 30 is provided with a waveform sensor that measures an operation waveform representing the state of an electrode-opening operation performed by the circuit contactor 41 and an operation waveform representing the state of an electrode-closing operation performed by the circuit contactor 41. The waveform sensor measures the operation waveforms by detecting movement of a component of the mechanism unit 32, the component being interlocked with the circuit contactor 41.

Each sensor sends measurement data to the diagnostic apparatus 100. The acquisition unit 12 illustrated in FIG. 1 acquires the measurement data. Note that the acquisition unit 12 may acquire measurement data from a sensor or sensors other than the sensors described in the first embodiment.

In the circuit breaker 30, operating time lengths in the pulling-out operation and the putting-in operation may change depending on conditions such as the air pressure or hydraulic pressure of the operation source 31, the temperature of the surroundings of the circuit breaker 30, and the control voltages. In addition, use of the circuit breaker 30 for many years may cause a secular change such as a decrease in air pressure or hydraulic pressure of the operation source 31 or deterioration of grease applied on the parts included in the mechanism unit 32. The operation speed of the circuit breaker 30 may become lower than at the beginning of using the circuit breaker 30 for the reason of such secular change. Such decrease in the operation speed may be a factor that causes the operating time length of the circuit breaker 30 to exceed a predetermined reference time length. When the control voltages decrease, currents flowing through the coils 36A and 36B decrease. Thereby, the operations of the plungers 37A and 37B are delayed, resulting in a longer operating time length. In addition, in the case where operating conditions are not appropriate, the operation speed may become excessive.

Next, a description will be given of factor probability calculation to be performed by the factor probability calculation unit 15. The factor probability calculation unit 15 illustrated in FIG. 1 observes a symptom of anomaly in the circuit breaker 30 based on the measurement data. The factor probability calculation unit 15 calculates a factor probability for each matter that may be a factor for the observed symptom. The diagnostic apparatus 100 diagnoses the symptom of anomaly in the circuit breaker 30 by calculating the factor probability for each matter considered as a possible factor for the symptom of anomaly.

FIG. 5 is a chart describing factor probability calculation to be performed by the factor probability calculation unit 15 included in the diagnostic apparatus 100 according to the first embodiment. FIG. 5 represents a specific example of calculation of factor probabilities along with examples of symptoms and factors in the form of a table.

The table illustrated in FIG. 5 shows, for each symptom that may occur in the circuit breaker 30, matters that may be factors for the symptom and assemblies where the factors may be caused. The column of "symptom of anomaly" shows details of symptoms that may occur in the circuit breaker 30. The column of "factor" shows details of matters that may be factors for the symptoms. The column of "assembly" shows the names of assemblies where the factors may be caused.

The symptom "decrease in operation speed" is one of symptoms of anomaly in which an operating time length in the pulling-out operation or the putting-in operation exceeds the reference time length, which represents a decrease in speed of an operation of the mechanism unit 32. The symptom "decrease in operation speed" is observed based on the measurement data obtained by the waveform sensor described above. Each of the matters "deterioration of grease", "decrease in hydraulic pressure", and "excessive operation control" is an example of a matter that may be a factor for the "decrease in operation speed". Furthermore, FIG. 5 illustrates that the assembly where the "deterioration of grease" is caused is the mechanism unit 32, that the assembly where the "decrease in hydraulic pressure" is caused is the operation source 31 that is of a hydraulic system, and that the assembly where the "excessive operation control" is caused is the operation control mechanism 33.

The symptom "overshoot of operation waveform" is one of symptoms of anomaly in which the operation speed of the mechanism unit 32 is too high, which is observed based on the measurement data obtained by the waveform sensor described above. Each of the matters "excessive hydraulic pressure" and "insufficient operation control" is an example of a matter that may be a factor for the "overshoot of operation waveform". Furthermore, FIG. 5 illustrates that the assembly where the "excessive hydraulic pressure" is caused is the operation source 31 that is of a hydraulic system, and that the assembly where the "insufficient operation control" is caused is the operation control mechanism 33.

In addition, in FIG. 5, the column of "verification data" shows verification data for each of the matters that may be factors for the symptoms. The verification data are data verified for each of symptoms that may occur in the circuit breaker 30, which are numerical values representing probabilities that the matters correspond to the factors for the symptoms. In the example illustrated in FIG. 5, it has been verified that the symptom "decrease in operation speed" may be caused by the "deterioration of grease" with a probability of 40%, may be caused by the "decrease in hydraulic pressure" with a probability of 30%, and may be caused by the "excessive operation control" with a probability of 30%. In addition, it has been verified that the symptom "overshoot of operation waveform" may be caused by the "excessive hydraulic pressure" with a probability of 30%, and may be caused by the "insufficient operation control" with a probability of 70%. The column of "verification data" shows numerical values representing such probabilities.

The data storage unit 18 stores information sets of details of symptoms and matters that may be factors for the symptoms, and the verification data on each of the matters. The data storage unit 18 stores the verification data obtained as a result of verification performed for each circuit breaker 30.

The factor probability calculation unit 15 calculates factor probabilities by correcting verification data for a symptom observed in the circuit breaker 30 based on the current state of the circuit breaker 30. The factor probability calculation unit 15 calculates a factor probability by correcting the verification data based on measurement data representing the current state of the circuit breaker 30. Furthermore, the factor probability calculation unit 15 calculates a factor probability by correcting the verification data based on the current state of the circuit breaker 30 determined from the history information. In the first embodiment, the factor probability calculation unit 15 corrects verification data by multiplying a value of the verification data by a weighting coefficient. The factor probability calculation unit 15 can obtain more accurate factor probabilities by performing correction based on the current state of the circuit breaker 30 so as to calculate the factor probabilities.

In FIG. 5, the "sensor information" is information obtained by a sensor that has measured the current state of the circuit breaker 30, which is information obtained based on the measurement data. The "history information" is information stored in the history storage unit 17 illustrated in FIG. 1, which is information representing the history of maintenance to which the circuit breaker 30 has been subjected. In the table of FIG. 5, the column of "sensor information, history information" shows the sensor information or the history information. Furthermore, the column of "sensor information, history information" shows coefficients to be used for correction of the verification data.

The item "grease reapplied" in the same row as the factor "deterioration of grease" in the column of "sensor information, history information" represents history information regarding the fact that grease was reapplied in the past. In the case where grease has been reapplied in the past, the possibility of deterioration of grease is lower than in the case where grease has not been reapplied. In this case, the factor probability calculation unit 15 can determine from the history information that it is at present unlikely that grease has deteriorated. The factor probability calculation unit 15 performs correction based on the current state such as this situation so that the value of "deterioration of grease" becomes lower than that of the verification data. In the example illustrated in FIG. 5, the factor probability calculation unit 15 corrects the verification data by multiplying the verification data by a coefficient of "0.3". A coefficient used in such a manner is adjusted based on a period from the reapplication of grease to the present moment. The shorter the period from the reapplication of grease to the present moment, the lower the possibility of deterioration of grease is, so that the coefficient is set to a smaller value.

The item "low hydraulic pressure" in the same row as the factor "decrease in hydraulic pressure" in the column of "sensor information, history information" represents sensor information regarding the fact that a measured hydraulic pressure is lower than a reference hydraulic pressure. The factor probability calculation unit 15 determines that the measured hydraulic pressure is low when a difference between the measured hydraulic pressure and the reference hydraulic pressure is larger than a preset threshold value. In this case, the factor probability calculation unit 15 is able to determine based on the sensor information that there is a higher possibility that the "decrease in hydraulic pressure" is the factor in question at present. The factor probability calculation unit 15 performs correction based on the current situation so that the value of "decrease in hydraulic pressure" becomes higher than that of the verification data. In the example illustrated in FIG. 5, the factor probability calculation unit 15 corrects the verification data by multiplying the verification data by a coefficient of "2.0". A coefficient used in such a manner is adjusted based on the degree of decrease in hydraulic pressure. The greater the degree of decrease in hydraulic pressure, the larger the coefficient is.

No sensor information nor history information is shown in the same row as the factor "excessive operation control" in the column of "sensor information, history information". It is assumed that regarding the operation control mechanism 33, there is no sensor information nor history information with use of which correction based on the current situation is required. The factor probability calculation unit 15 sets a coefficient for the "excessive operation control" to "1.0", so that no correction is performed on the verification data.

In FIG. 5, a "factor value" represents a value obtained by multiplication of the verification data by a coefficient. The "factor probability" represents the ratio of a factor value for each factor to the sum of factor values. Thus, in the example illustrated in FIG. 5, the factor probability calculation unit 15 makes calculations of the factor probabilities of the matters "deterioration of grease", "decrease in hydraulic pressure", and "excessive operation control" as "12%", "59%", and "29%", respectively for the symptom "decrease in operation speed".

These calculation results indicate that a decrease in the speed of operation in the current situation may be caused by a deterioration of grease with a probability of 12%, may be caused by a decrease in hydraulic pressure with a probability of 59%, and may be caused by excessive operation control with a probability of 29%.

In the example illustrated in FIG. 5, the factor probability calculation unit 15 makes calculations of the factor probabilities of the matters "excessive hydraulic pressure" and "insufficient operation control" as "46%" and "54%", respectively for the symptom "overshoot of operation waveform". These calculation results indicate that the overshoot of operation waveform in the current situation may be caused by an excessive hydraulic pressure with a probability of 46%, and may be caused by insufficient operation control with a probability of 54%.

When a symptom of anomaly is observed in the circuit breaker 30, the display unit 14 illustrated in FIG. 1 displays the calculation results of factor probabilities from the factor probability calculation unit 15 for the observed symptom. The display unit 14 may use a table as illustrated in FIG. 5 to display the calculation results of the factor probabilities together with information sets on details of the observed symptom, matters considered as possible factors, and assemblies where the factors may be caused. As a result, the display unit 14 can display a factor probability for each matter that may be a factor for the observed symptom in an easily understandable manner.

The display unit 14 can provide useful information for improving the operating state of the circuit breaker 30 by displaying the calculation results of the factor probabilities.

Next, a description will be given of determination of details of a proposal to be made by the improvement processing unit 16. The improvement processing unit 16 determines details of a proposal for improving the observed symptom based on the calculation results of factor probabilities from the factor probability calculation unit 15. Determination of details of a proposal for improvement enables the diagnostic apparatus 100 to make a proposal for improving the state of the circuit breaker 30 so that the state of the circuit breaker 30 is better than the current state before a malfunction is caused by some anomaly in the circuit breaker 30.

FIG. 6 is a chart describing determination of details of a proposal to be made by the improvement processing unit 16 included in the diagnostic apparatus 100 according to the first embodiment. FIG. 6 illustrates examples of details of a proposal determined by the improvement processing unit 16 in the form of a table.

The table illustrated in FIG. 6 shows "improvement details" for improving symptoms observed by the factor probability calculation unit 15. The column of "adjustment item" shows the contents of items for which adjustments are proposed so as to improve the symptoms. The column of "adjustment rate" shows adjustment balances for each adjustment item.

When a factor probability for each of the factors "decrease in hydraulic pressure" and "excessive operation control" in the symptom "decrease in operation speed" is higher than a preset threshold value, the improvement processing unit 16 determines each of the items "improvement in hydraulic pressure" and "relaxation of operation control" to be an object for an adjustment item. The improvement processing unit 16 determines adjustment rates by referring to adjustment rates associated with combinations of the adjustment items in advance. Data sets on such adjustment rates are stored in the data storage unit 18 illustrated in FIG. 1. In the data on an adjustment rate, a numerical value of the adjustment rate that can be applied for improvement of the symptom is associated with a combination of the adjustment items. The data on a adjustment rate is obtained based on, for example, the track record of improving symptoms in the circuit breaker 30.

In the example illustrated in FIG. 6, the adjustment rates of the adjustment items for "improvement in operation speed" have been determined such that the adjustment rates of the adjustment items "improvement in hydraulic pressure" and "relaxation of operation control" are "80%" and "20%", respectively. In the example illustrated in FIG. 6, the improvement processing unit 16 has determined proposal details such that the adjustment rates of the adjustment items "improvement in hydraulic pressure" and "relaxation of operation control" for the "improvement in operation speed" are "80%" and "20%", respectively.

In the example illustrated in FIG. 6, the improvement processing unit 16 determines that each of the items "relaxation of hydraulic pressure" and "improvement in operation control" be an object for an adjustment item for the improvement details "elimination of overshoot". In the example illustrated in FIG. 6, the improvement processing unit 16 has determined proposal details such that the adjustment rates of the adjustment items "relaxation of hydraulic pressure" and "improvement in operation control" for the "elimination of overshoot" are "10%" and "90%", respectively.

Note that the improvement processing unit 16 may correct the values of the adjustment rates based on the current state of the circuit breaker 30, as in the case of the factor probability calculation unit 15. The improvement processing unit 16 can correct a value of an adjustment rate by multiplying the value of the adjustment rate by a weighting coefficient. The improvement processing unit 16 can make a more accurate proposal by correcting the adjustment rate based on the current state of the circuit breaker 30.

The display unit 14 illustrated in FIG. 1 displays details of a proposal determined by the improvement processing unit 16. The display unit 14 may display the details of improvement, the adjustment items, and the adjustment rates with use of a table as illustrated in FIG. 6. As a result, the display unit 14 can display the details of the proposal for improving the symptoms in an easily understandable manner. The display unit 14 can provide useful information for improving the operating state of the circuit breaker 30 by displaying the details of the proposal for improving the symptoms.

When the adjustment item "improvement in hydraulic pressure" is proposed for the improvement details "improvement in operation speed", an operator can make adjustments for improving the speed of operation by improving the hydraulic pressure of the operation source 31. When the adjustment item "relaxation of operation control" is proposed for the improvement details "improvement in operation speed", the operator can make adjustments for improving the speed of operation by reducing the viscosity of oil in the operation control mechanism 33. The operator is able to reduce the viscosity of the oil by raising the temperature of the surroundings of the operation control mechanism 33.

When the adjustment item "relaxation of hydraulic pressure" is proposed for the improvement details "elimination of overshoot", the operator can make adjustments for eliminating overshoot by reducing the hydraulic pressure of the operation source 31. When the adjustment item "improvement in operation control" is proposed for the improvement details "elimination of overshoot", the operator can make adjustments for eliminating the overshoot by improving the viscosity of the oil in the operation control mechanism 33. The operator can improve the viscosity of the oil by lowering the temperature of the surroundings of the operation control mechanism 33.

In this way, the diagnostic apparatus 100 provides the operator with details of a proposal determined by the improvement processing unit 16. As a result, the diagnostic apparatus 100 can urge the operator to make adjustments for improving the symptom in question, even if detailed investigation has not been conducted for identifying a factor in the symptom. The operator is able to improve the condition of the circuit breaker 30 before the circuit breaker 30 malfunctions due to some anomaly, by making adjustments according to the details of the proposal.

According to the first embodiment, the diagnostic apparatus 100 can obtain useful information for improving the operating state of a device to be diagnosed, by causing the factor probability calculation unit 15 to calculate factor probabilities for an observed symptom. The diagnostic apparatus 100 can obtain useful information for improving the operating state of the device to be diagnosed, by causing the improvement processing unit 16 to determine details of a proposal for improving the observed symptom. As a result, the diagnostic apparatus 100 has an advantageous effect that useful information for improving the operating state of the device can be obtained.

The configurations set forth in the above embodiment show examples of the contents of the present invention, and can each be combined with other publicly known techniques and partially omitted and/or modified without departing from the scope of the present invention.

REFERENCE SIGNS LIST 10 control unit; 11 storage unit; 12 acquisition unit; 13 input unit; 14 display unit; 15 factor probability calculation unit; 16 improvement processing unit; 17 history storage unit; 18 data storage unit; 21 processing circuit; 22 input interface; 23 external storage device; 24 input device; 25 display; 26 processor; 27 memory; 30 circuit breaker; 31 operation source; 32 mechanism unit; 33 operation control mechanism; 34, 35 switch; 36A, 36B coil; 37A, 37B plunger; 38A, 38B latch; 40 electric path; 41 circuit contactor; 100 diagnostic apparatus.

The invention claimed is:

1. A diagnostic apparatus for diagnosing a symptom of an anomaly in a device configured to perform an operation for making or breaking a circuit, the apparatus comprising:
    a processor encoded with program code for diagnosing a symptom of an anomaly in a device, when executed the program code configuring the processor to:
        receive data associated with the device, the data measuring an operational state of the device;
        calculate a factor probability for each matter that may be a factor in a symptom observed in the device based on the received data, the factor probability being a probability that the matter truly corresponds to a factor for the observed symptom; and
    data storage circuitry configured to store:
        verification data being data verified for each of symptoms that may occur in the device, the verification data representing probabilities that two or more matters that may be factors for the symptoms truly correspond to the factors for the symptoms, respectively; and
        history information representing a history of maintenance to which the device has been subjected;
    the processor being further configured by the program code to:
        generate details of a proposal for improving the observed symptom, based on calculation results of the factor probabilities,
        calculate the factor probabilities by correcting the verification data on the symptom observed in the device, based on a current state of the device determined from the history information,
        the details of the proposal determined by the improvement processing unit include items and adjustment rates, the items being proposed to be adjusted for improving a symptom, the adjustment rates representing an adjustment balance for each item in a combination of the items, and
        the adjustment rates are obtained based on a track record of improving a symptom in the device stored in the data storage circuitry.

2. The diagnostic apparatus according to claim 1, comprising a display configured to display calculation results of the factor probabilities generated by the processor.

3. The diagnostic apparatus according to claim 2, wherein the processor is configured to correct the adjustment rates based on the current state of the device.

4. The diagnostic apparatus according to claim 3, comprising a display configured to display the calculation results, the factor probabilities, and the details of the proposal generated by the processor.

5. The diagnostic apparatus according to claim 2, comprising a display unit configured to display the calculation results, the factor probabilities, and the details of the proposal generated by the processor.

6. The diagnostic apparatus according to claim 1, comprising a display configured to display the calculation results, the factor probabilities, and the details of the proposal generated by the processor.

7. The diagnostic apparatus according to claim 1, wherein the processor is configured to correct the adjustment rates based on the current state of the device.

8. The diagnostic apparatus according to claim 7, comprising a display configured to display the calculation results, the factor probabilities, and the details of the proposal generated by the processor.

* * * * *